United States Patent [19]

Hacke

[11] 4,210,926
[45] Jul. 1, 1980

[54] INTERMEDIATE MEMBER FOR MOUNTING AND CONTACTING A SEMICONDUCTOR BODY

[75] Inventor: Hans J. Hacke, Munich, Fed. Rep. of Germany

[73] Assignee: Siemens Aktiengesellschaft, Berlin & Munich, Fed. Rep. of Germany

[21] Appl. No.: 21,235

[22] Filed: Mar. 16, 1979

Related U.S. Application Data

[63] Continuation of Ser. No. 858,395, Dec. 7, 1977, abandoned.

[51] Int. Cl.² .................... H01L 23/48; H01L 29/44; H01L 29/52
[52] U.S. Cl. ........................................ 357/70; 357/65; 357/68; 357/71
[58] Field of Search .................. 357/65, 67, 68, 69, 357/70, 71

[56] References Cited

U.S. PATENT DOCUMENTS

| | | | |
|---|---|---|---|
| 3,478,420 | 11/1969 | Grimes et al. | 357/65 |
| 3,559,285 | 2/1971 | Kauffman | 357/71 |
| 3,596,228 | 7/1971 | Reed | 357/65 |
| 3,868,724 | 2/1975 | Perrino | 357/70 |
| 4,045,863 | 9/1977 | Mitterhummer | 29/588 |
| 4,099,200 | 7/1978 | Koutalides | 357/69 |

OTHER PUBLICATIONS

RCA Technical Notes; by Hausman TN No. 848, Sep. 4, 1969, pp. 1 & 2.

*Primary Examiner*—Andrew J. James
*Attorney, Agent, or Firm*—Hill, Van Santen, Steadman, Chiara & Simpson

[57] ABSTRACT

An intermediate carrier with several contact fingers is disclosed for the support and contacting of a semiconductor member. The contact fingers have an outer contact and an inner contact. An inner contact is provided for each electrode of the semiconductor member. In relation to the adjoining areas of the contact fingers, the inner contacts are constructed as raised projections or bumps. The space required between the contact fingers and the semiconductor member is produced primarily by the projections or bumps.

7 Claims, 8 Drawing Figures

INTERMEDIATE MEMBER FOR MOUNTING AND CONTACTING A SEMICONDUCTOR BODY

This is a continuation, of application Ser. No. 858,395, filed Dec. 7, 1977 now abandoned.

BACKGROUND OF THE INVENTION

The invention relates to an intermediate member or subcarrier for mounting and contacting a semiconductor body by use of contact fingers which, in each case, have an outer contact and an inner contact corresponding to an electrode of the semiconductor body. An inventive process for the production of this kind of metallic intermediate member is also described.

Intermediate members of the above type are utilized to an increasing degree in the installation or mounting of semiconductor bodies, since they permit a simultaneous contacting of all the electrodes of the semiconductor body, instead of the previously commonly employed individual contacting via wires. As intermediate members or subcarriers, not only metallic structures on a synthetic material band are known, but also purely metallic formed parts which can be produced by etching or electroplating techniques. Semiconductor bodies which are contacted in this manner can be installed in conventional system carriers, referred to as spiders, or spray-coated to form a housing, (British Pat. No. 1,199,848) or directly installed in film circuits or printed circuits.

This kind of contacting also involves certain precautions with respect to semiconductor bodies, however. All electrodes of the semiconductor bodies must be provided with connection bumps or projections. As a result, the connection point becomes accessible, and the contact finger of the intermediate member is held at a distance by the hard copper core of the bump, and thus the danger of short circuits to the surface of the semiconductor body is avoided. However, the production of the connection bumps on the semiconductor body causes difficulties, since, during the build-up, the covering and passivation layer on the surface is damaged or its adhesive strength is diminished. That, in turn, diminishes the yield, increases the short-circuit danger during the contacting, and decreases the reliability in operation.

SUMMARY OF THE INVENTION

It is an object of the invention to provide an intermediate member for mounting and contacting a semiconductor body and which permits a reliably operating and inexpensively formed contacting.

This objective is accomplished in an intermediate member according to the invention since inner contacts are provided as raised bumps or projections at least opposite adjacent regions of the contact fingers. In the intermediate member of the invention, the distance necessary between contact fingers and the semiconductory body is thus provided in greater part by the projections on the contact fingers. As a result, the electrodes on the semiconductor body only need to be provided with a contactable layer of small thickness, and the passivation layer is not damaged by protracted build-up operations. Furthermore, it is possible to build up connection projections of soft material, e.g. tin-lead, on the semiconductor body, such as are customary, in flip-chip contactings, without the danger of short circuits during the contacting operation.

In a preferred embodiment form of the invention, the bumps or projections and outer contacts are constructed as raised regions from the material of the contact fingers. In this way the entire intermediate member or, respectively, the metallic structure of the intermediate member can be produced in one piece. Preferably in this case, the projections and outer contacts have double the thickness of the remaining regions of the contact fingers.

In a further refinement of the invention at least those regions of the contact fingers bordering on the projections are provided with a solder repelling surface. Therefore it is possible to apply solder in a defined manner in the region of the projections. In addition, in the contacting of a semiconductor body, the flowing-away of solder is prevented and thus the danger of short circuits is further diminished.

For facilitating the contacting of a semiconductor body and for easier further wiring, the projections and the outer contacts can be covered with an easily contactable surface layer. Preferably the surface layer consists here of tin, tin-lead, or gold.

The construction of the inner contacts as raised projections can be realized especially advantageously and without particular expense in the etching technique production of purely metallic intermediate members. The invention also describes a process for the production of purely metallic intermediate members in which a first etching resistant layer with the positive image of the entire intermediate member is applied on one side of a carrier sheet. A second etching resistant layer with the positive image of the projections and of the outer contacts is applied on the opposite side. The intermediate member is then constructed out of the carrier sheet by etching both sides. By means of the cited process, it is possible, with a minimum number of work steps, to concurrently produce the projections during the etching technique production of the intermediate members. Since, during the two-sided etching the entire structure of the intermediate member is uncovered on top, and only the projections and the outer contacts are uncovered on the bottom, the cross-section of the contact fingers is decreased to half the original thickness, so that the projections and the outer contacts remain as raised zones.

In a first embodiment of the above described process, etching masks are applied as the first and second etching resistant layers. The etching masks are removed after the etching. In this way known photolithographic processes can be employed for the structure production. After removal of the etching masks, the projections and the opposite surfaces of the contact fingers can be covered with an easily contactable surface layer.

In a second embodiment of the above described process an easily contactable surface layer is applied, by galvanic metal deposition, as first and second etching resistant layers. In the process, the galvanic masks necessary for structuring can again be produced by known photolithographic processes.

In both embodiment forms of the process for the production of metallic intermediate members, at least the regions of the contact fingers adjacent to the projections are provided with a solder repelling surface, preferably after the etching. Therefore the flowing away of solder is later prevented and a selective metal deposition becomes possible.

DESCRIPTION OF THE PREFERRED EMBODIMENTS

FIGS. 2 to 8 represent sectional views in which, for better illustration, the material thicknesses have been expanded. In all the figures, components corresponding to one another are provided with the same reference numbers.

Figure 1:
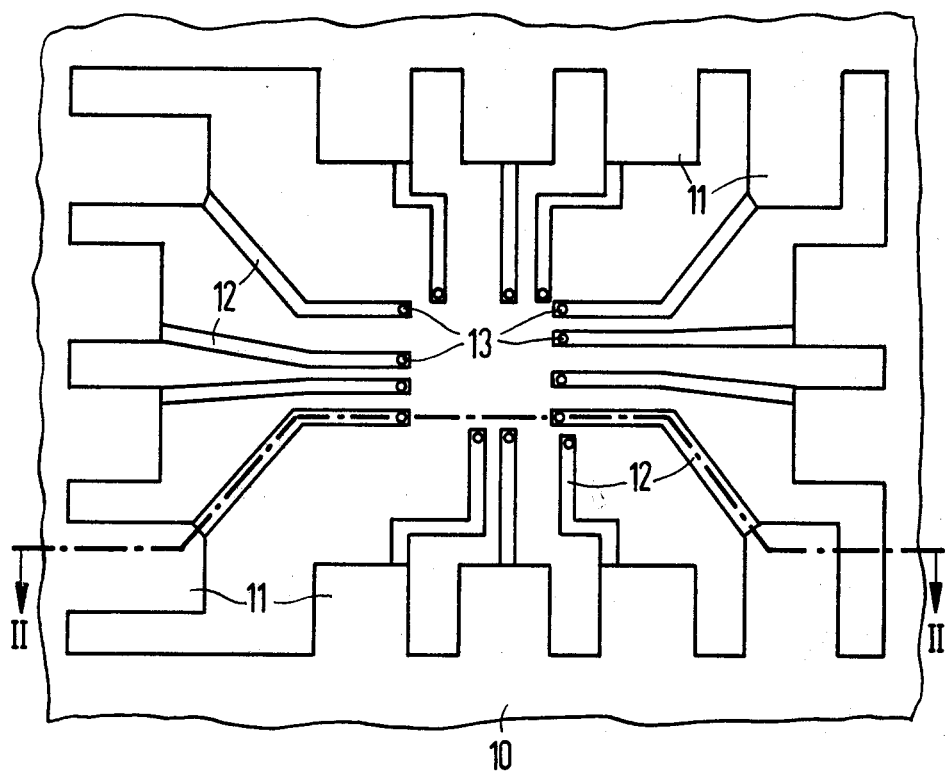
FIG. 1 illustrates in plan view an intermediate member whose inner contacts are embodied as raised projections.

FIG. 1 illustrates in plan view a cut out of a sheet metal band out of which the structures of several connected intermediate members or subcarriers have been etched. The illustrated intermediate member includes an outer frame 10 on which, for example, a total of fourteen outer contacts 11 are suspended. Starting from each outer contact 11 a contact finger 12 projects into the frame interior. At the inner end of the contact fingers 12 there is in each case an inner contact arranged, which is embodied as a raised bump or projection 13. As shown in sectional view of FIG. 2, the contact fingers 12 are etched away in the region between the projections 13 and the outer contacts 11, to half the original thickness so that the projections 13 and the outer contacts 11 form raised regions. The outer contacts 11, the projections 13, and the opposite surface of the intermediate member are covered with an easily contactable surface layer 21, 22, or 23, respectively, while the etched regions are provided with a solder repelling surface 31 or 32, respectively. In the contacting of a semiconductor body 4 whose electrodes are only provided with a contactable layer 41 of small thickness, the solder repelling surface 31 and 32 prevents the flowing away of solder or of contactable material. After the contacting operation, the outer contacts 11 can then be connected to the inner connection legs of a metallic system carrier, or also be directly contacted with the corresponding terminals of a film circuit or of a printed circuit. Subsequently the outer frame 10 necessary for manipulation is separated away.

Figure 2:
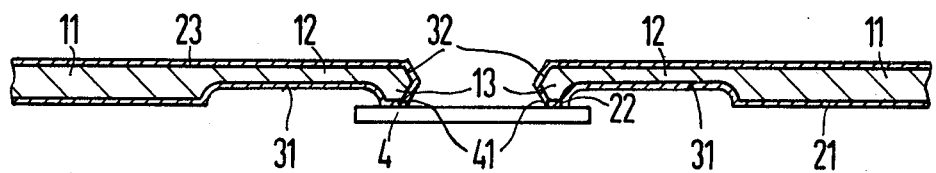
FIG. 2 is a cross-sectional view along line II—II of FIG. 1 but with a semiconductor body in contact.
Figure 3:
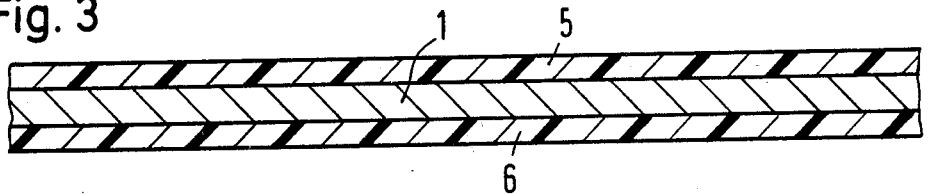
FIGS. 3 to 6 are side views illustrating preferred process steps for the production of the intermediate member represented in FIGS. 1 and 2.
Figure 4:
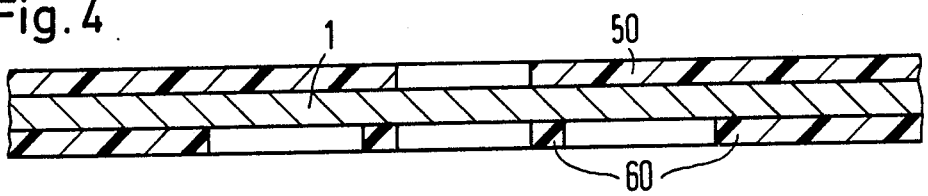
Figure 5:
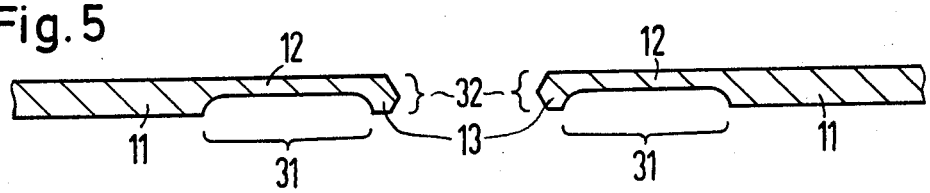

In a first inventive process for the production of the intermediate member or subcarrier represented in FIGS. 1 and 2, the starting point is, in accordance with FIG. 3, a carrier sheet 1 which may also be provided in the form of a band. An upper photolacquer layer 5 or, respectively, a lower photolacquer layer 6 is then applied onto the surfaces of this carrier sheet 1, which consists, for example, of copper, and is exposed in such a way that etching masks 50 or 60 are formed in accordance with FIG. 4 after the developing. The etching mask 50 covers the entire surface of the later formed structure of the intermediate member while the etching mask 60 covers the regions of the projections and the outer contacts. The intervening regions of the contact fingers are left unexposed. During the subsequent two-sided etching attack, the structure of the intermediate member with the outer contacts 11, the contact fingers 12, and the projections 13 is thus formed. The contact fingers 12, which are subjected to a one-side etching attack, are thinned out to half the thickness of the remaining regions. Copper chloride or an ammoniacal sodium chlorite etching solution, for example, are suitable etching agents. Immediately after the etching, the exposed etched surfaces are passivated so that the solder repelling surfaces 31 or 32, respectively, are formed. The passivation can be performed, for example, by immersion in an aqueous liver of sulphur solution. In a liver of sulphur solution with about 2.5 g of liver of sulphur per liter of tap water, a lasting solder repelling copper sulfide layer is formed on the exposed surfaces after, for example, about five minutes. After the passivation, the etching masks 50 and 60 are removed so that the completed intermediate member according to FIG. 5 remains. Then, according to FIG. 6, if the surface is not suitable for contacting in this condition, an easily contactable surface layer, consisting for example of tin, tin-lead, or gold, can still be applied, namely as layers 21, 22 and 23. The application of the surface layer can be done, for example, by currentless or galvanic metal deposition or by means of hot tin-plating, with the solder repelling regions 31 and 32 remaining uncovered.

Figure 6:
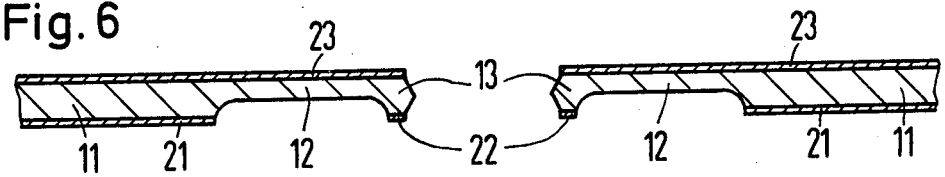
Figure 7:
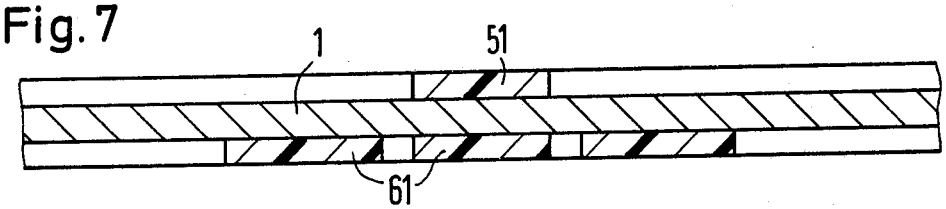
FIGS. 7 and 8 illustrate other preferred processes for the production of the intermediate member represented in FIGS. 1 and 2.
Figure 8:
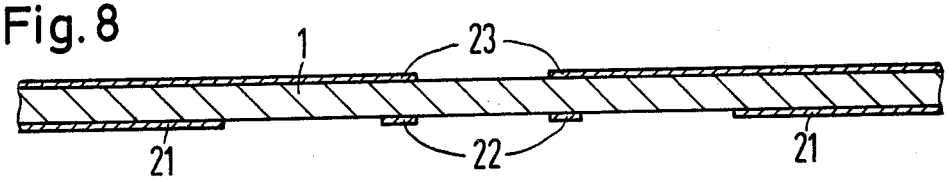

In a second embodiment of a process for the production of the intermediate member represented in FIGS. 1 and 2, the photolacquer layers 5 and 6 illustrated in FIG. 1 are exposed in such a way that, after the developing, galvanic masks 51 or 61 are formed in accordance with FIG. 7. As is represented in FIG. 8, the surface layers 21, 22 and 23 consisting of tin or tin-lead are applied by galvanic metal deposition, and the galvanic masks 51 and 61 are removed. In a subsequent selective etching operation with two-sided etching attack, which can, for example, again be carried in an ammoniacal sodium chlorite etching solution, the intermediate member illustrated in FIG. 6 is then formed. If this intermediate member is immersed in an aqueous liver of sulphur solution, then a sulphur repelling copper sulfide layer forms on the regions 31 and 32 represented in FIG. 5, while the surface regions consisting of tin or tin-lead are not altered by the liver of sulphur solution.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An intermediate member system for mounting and contacting a semiconductor body, comprising:
    a semiconductor body having thin electrodes, said electrodes having a height above a top surface of the semiconductor body which provides insufficient clearance to permit direct lateral contacting;
    self-supporting metal contact fingers which each have an outer contact and an inner contact, each inner contact connecting by solder with one of said semiconductor body electrodes, each of the inner contacts being provided as an integral raised projection with respect to adjacent bordering portions of the fingers and formed by a depression in the fingers, a height of said projection being sufficient to prevent contact between said adjacent bordering portions of the finger and the top surface of the semiconductor body, a connection facing surface of the inner contact not overlapping the electrode of the semiconductor body;

support frame means connecting to said outer contacts;

and a solder repelling layer provided in said depression and adjacent to each inner contact connection with the semiconductor electrode.

2. The system of claim 1 in which the raised projections are of the same material as the fingers.

3. The system of claim 1 wherein a portion of the contact fingers with the outer contacts is substantially wider than a portion of the contact fingers with the inner contacts.

4. The system of claim 1 wherein the outer contacts connect to a metallic system carrier.

5. The system of claim 1 wherein the raised projection and outer contact have approximately twice the vertical thickness of other regions of the contact fingers.

6. The system of claim 1 wherein the raised projection and the outer contact are covered with an easily contactable surface layer means as compared to the contactability of the material of the fingers for solder connection to the semiconductor body electrodes and the support frame means.

7. The system of claim 6 wherein the surface layer means is comprised of an element selected from the group consisting of tin, tin-lead, and gold.

* * * * *